United States Patent [19]
Lou

[11] Patent Number: 6,074,942
[45] Date of Patent: Jun. 13, 2000

[54] METHOD FOR FORMING A DUAL DAMASCENE CONTACT AND INTERCONNECT

[75] Inventor: Chine-Gie Lou, Hsinchu Hsien, Taiwan

[73] Assignee: Worldwide Semiconductor Manufacturing Corporation, Hsinchu, Taiwan

[21] Appl. No.: 09/089,875

[22] Filed: Jun. 3, 1998

[51] Int. Cl.[7] .............................................. H01L 21/4763
[52] U.S. Cl. ........................ 438/632; 438/637; 438/640; 438/673; 438/698; 438/701; 438/723; 438/624
[58] Field of Search ........................... 438/632, 633–634, 438/618, 620, 622, 637–640, 624, 666–668, 672–673, 675, 692, 701, 713, 723–724, 743–744

[56] References Cited

U.S. PATENT DOCUMENTS

| | | | |
|---|---|---|---|
| 5,453,403 | 9/1995 | Meng et al. ............................ | 438/734 |
| 5,741,626 | 4/1998 | Jain et al. ............................. | 438/636 |
| 5,801,094 | 9/1998 | Yew et al. ............................. | 438/624 |

*Primary Examiner*—Charles Bowers
*Assistant Examiner*—Thanh Nguyen
*Attorney, Agent, or Firm*—Blakely, Sokoloff, Taylor, & Zafman

[57] ABSTRACT

A method of forming a dual damascene structure including contacts and interconnects over a substrate is disclosed. The method comprises the steps of: forming an insulating layer on said substrate; forming a nitride layer over said insulating layer; forming a cap oxide layer over said nitride layer; patterning and etching said insulating layer, nitride layer, and cap oxide layer to correspond to the location of said contacts; patterning and etching said nitride layer and said cap oxide layer to correspond to the pattern of said interconnects; and performing a reflow step.

13 Claims, 2 Drawing Sheets

METHOD FOR FORMING A DUAL DAMASCENE CONTACT AND INTERCONNECT

TECHNICAL FIELD OF THE INVENTION

This invention relates to a combination contact and interconnect, and more particularly, to an improved method for making a dual damascene contact and interconnect.

BACKGROUND OF THE INVENTION

Damascene is an interconnection fabrication process in which grooves are formed in an insulating layer and filled with metal to form conductive lines (interconnects). Dual damascene is a multi-level interconnection process in which, in addition to forming the grooves of single damascene, conductive contact (or via) openings are also formed. In the standard dual damascene process, a single or composite insulating layer (typically oxide) is coated with a photoresist which is exposed through a first mask with the image pattern of the contact openings and the pattern is etched. A second mask pattern is then formed with the interconnect pattern. The insulating layer is then etched a second time. Finally, a conductive material such as aluminum or copper is deposited into the grooves and contact openings formed in the insulating layer. Additionally, a Ti or TiN layer may be used as a barrier layer or to act as an adhesion layer.

However, as the level of integration increases, and as the dual damascene structures become smaller, the Ti or TiN layer is difficult to deposit uniformly into deep sub-micron contact openings.

What is needed is a new process for forming a dual damascene contact and interconnect.

SUMMARY OF THE INVENTION

A method of forming a dual damascene structure including contacts and interconnects over a substrate is disclosed. The method comprises the steps of: forming an insulating layer on said substrate; forming a nitride layer over said insulating layer; forming a cap oxide layer over said nitride layer; patterning and etching said insulating layer, nitride layer, and cap oxide layer to correspond to the location of said contacts; patterning and etching said nitride layer and said cap oxide layer to correspond to the pattern of said interconnects; and performing a optimum reflow step.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
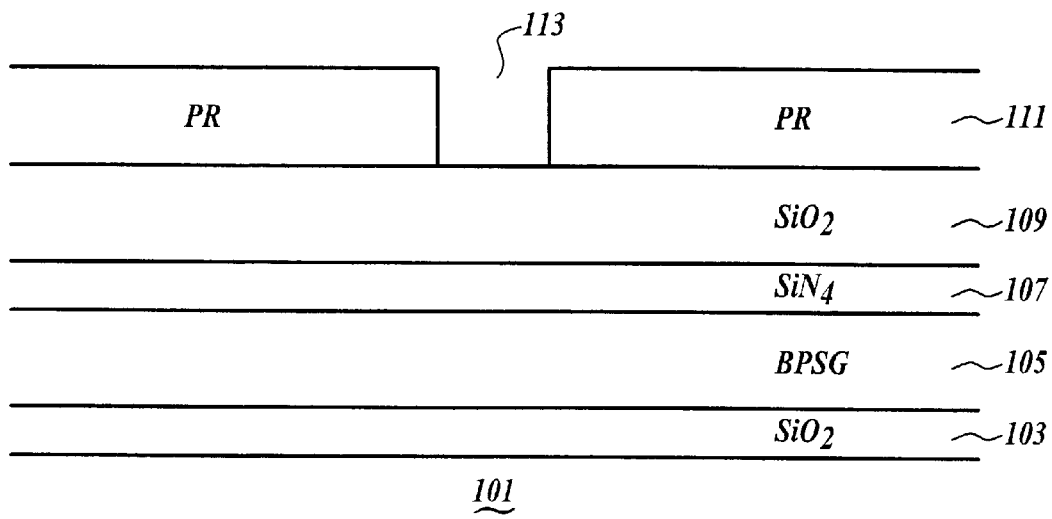
FIGS. 1–4 are cross-sectional views of a semiconductor substrate illustrating the steps of the present invention for forming a dual damascene contact and interconnect.

The present invention will be described in detail with reference to the accompanying drawings. Turning to FIG. 1, a semiconductor substrate 101 is shown. The substrate is understood to possibly include a semiconductor wafer, active and passive devices formed within the wafer, and layers formed on the wafer's surface. The term "substrate" is meant to include devices formed within a semiconductor wafer and the layers overlying the wafer. The term "substrate surface" is meant to include the uppermost exposed layers on a semiconductor wafer, such as a silicon surface, an insulating layer, and metal lines.

Turning first to FIG. 1, a liner oxide layer 103 is formed atop the substrate 101. Preferably, the liner oxide layer 103 is formed of silicon dioxide to a thickness of approximately 500–1500 angstroms. The silicon dioxide may be deposited using a conventional chemical vapor deposition (CVD) technique.

Next, an insulating layer 105 is formed using conventional CVD techniques atop the liner oxide layer 103. Preferably, the insulating layer 105 is borophophosilicate-glass (BPSG) or phosphosilicateglass (PSG). The preferred layer is BPSG having a thickness of 2000 to 6000 angstroms. The insulating layer 105 is then polished by chemical mechanical polishing (CMP) for global planarization.

Next, a nitride layer 107 is formed over the BPSG layer 105. Preferably, the nitride layer 107 is approximately 300–1000 angstroms thick and formed from a conventional CVD technique. After the nitride layer 107 has been formed, a second insulating layer 109 (referred to as a cap oxide) is formed atop the nitride layer 107. The second insulating layer 109 is preferably silicon dioxide and is formed using a conventional CVD technique. The second insulating layer 109 preferably has a thickness of between 4000 to 7000 angstroms. Still referring to FIG. 1, finally, a first photoresist layer 111 is coated and developed to include a contact opening 113. The first photoresist layer 111 has a pattern that coincides with the desired contact locations to the substrate 101.

Figure 2:
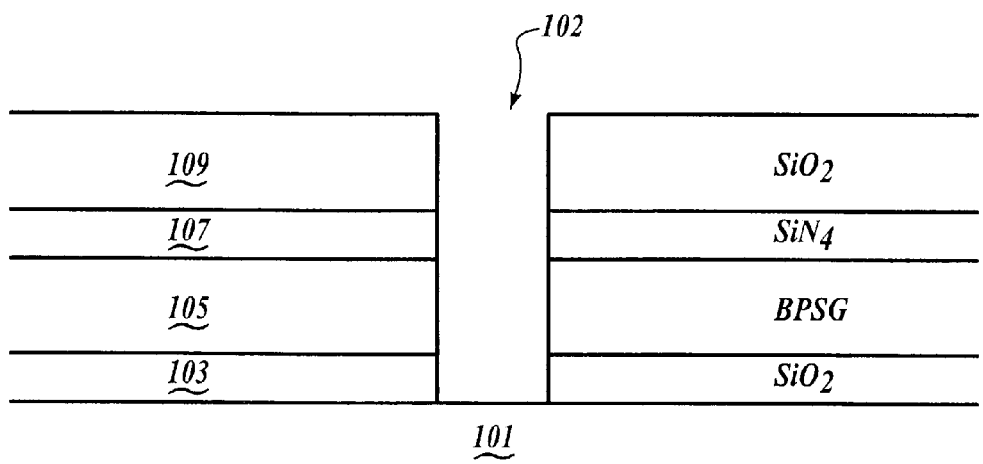

Turning to FIG. 2, contact openings 102 are then formed in the stacked layers comprising liner oxide 103, BPSG 105, nitride layer 107, and second insulating layer 109. Note that the contact openings 102 are preferably of cylindrical shape, although may be formed into any desired shape. The photoresist layer 111 is used as a mask to etch the stacked insulating dielectric layers (103–109). The etching used may be preferably a reactive ion etch (RIE). As noted above, the pattern of the first mask 111 is dictated by the desired positions of contacts to the underlying substrate 101.

Figure 3:
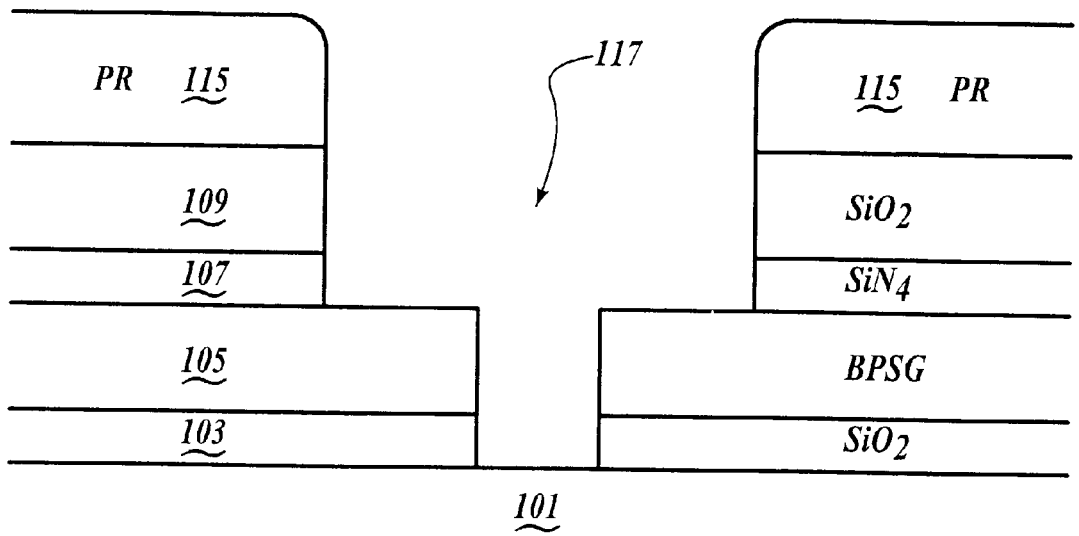

After the first etching step, turning to FIG. 3, a second mask 115 formed from photoresist is used to etch the second insulating layer 109 and nitride layer 107. The pattern of the second mask 115 is dictated by the desired interconnect pattern to be formed in the second insulating layer 109 and nitride layer 107. After the RIE etching, the second mask 115 is then stripped leaving the dual damascene opening 117 (also referred to as contact and interconnect openings).

Figure 4:
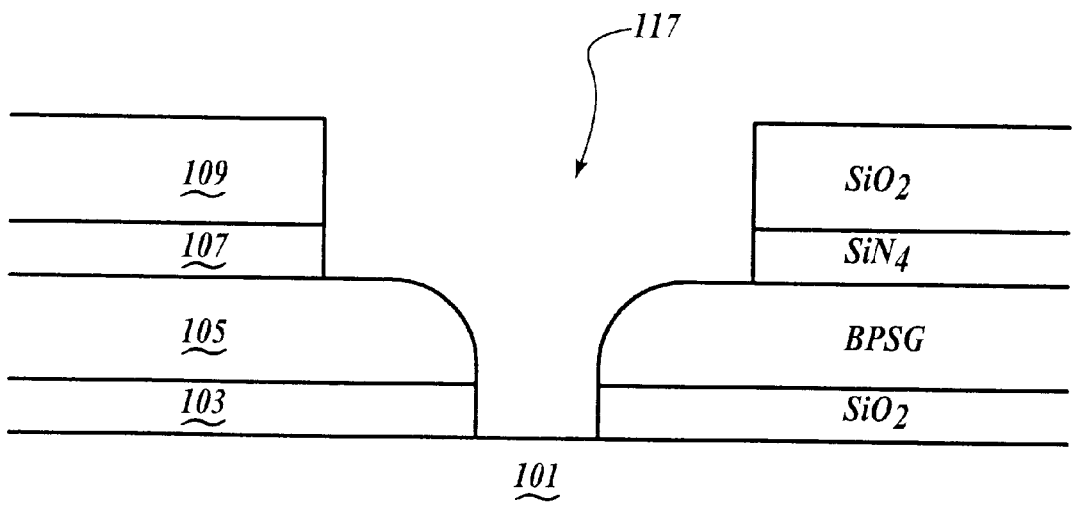

Turning next to FIG. 4, a reflow step is performed with the purpose of rounding the corners of the contact opening 102. Specifically, the reflow step is a rapid thermal processing (RTP) step at 950° C. to 1100° C. for 10 to 30 seconds. Alternatively, an atmospheric pressure CVD step at 850° C. to 900° C. for 5 to 30 minutes may be utilized. As can be seen in FIG. 4, the result of the reflow step is the rounding of the corners of the contact opening 102. This rounding allows much better step coverage for the titanium or titanium nitride barrier layer, particularly for deep submicron devices.

It can be appreciated by those skilled in the art that there are other methods of making the dual damascene opening 117, such as the use of a half-tone optical mask, or the use of multiple thickness photoresist layers.

The opening 117 is then filled with a conductive material. Such a conductive material includes, for example, copper, tungsten, or aluminum. In the preferred embodiment, the plug is filled with aluminum. Additionally, in the preferred embodiment, a titanium or titanium nitride barrier layer may be deposited into the opening 117.

While the preferred embodiment of the invention has been illustrated and described, it will be appreciated that various changes can be made therein without departing from the spirit and scope of the invention. For example, while the preferred embodiment has been described in the context of a contact and interconnect structure, the teachings of the present invention clearly can be applied to intermetal via and interconnection structures.

The embodiments of the invention in which an exclusive property or privilege is claimed are defined as follows:

1. A method of forming a dual damascene structure including contacts and interconnects over a substrate, the method comprising the steps of:

forming an insulating layer on said substrate, said insulating layer formed from borophosphosilicate glass (BPSG) or phosphosilicate glass (PSG);

forming a nitride layer over said insulating layer;

forming a cap oxide layer over said nitride layer, said cap oxide layer being silicon dioxide having a higher reflow temperature than said insulating layer;

patterning and etching said insulating layer, said nitride layer, and said cap oxide layer to correspond to the location of said contacts;

patterning and etching said nitride layer and said cap oxide layer to correspond to the pattern of said interconnects; and performing a reflow process.

2. The method of claim 1 further including the step of forming a liner oxide between said substrate and said insulating layer.

3. The method of claim 1 further including the step of polishing said insulating layer by CMP.

4. The method of claim 1 wherein said nitride layer is $Si_3N_4$.

5. The method of claim 1 further including the step of filling said dual damascene structure with a conductive material.

6. The method of claim 1 wherein said reflow step is a RTP at 950° C. to 1100° C. for 10 to 30 seconds.

7. The method of claim 1 wherein said reflow step is an atmospheric pressure CVD step at 850° C. to 900° C. for 5 to 30 minutes.

8. A method of forming a contact and interconnect structure over a substrate, the method comprising the steps of:

forming an insulating layer on said substrate, said insulating layer formed from borophosphosilicate glass (BPSG) or phosphosilicate glass (PSG);

forming a nitride layer over said insulating layer;

forming a cap oxide layer over said nitride layer, said cap oxide layer being silicon dioxide having a higher reflow temperature than said insulating layer;

patterning and etching said insulating layer, said nitride layer, and said cap oxide layer to correspond to the location of said contacts, thereby forming contact openings;

patterning and etching said nitride layer and said cap oxide layer to correspond to the pattern of said interconnects, thereby forming interconnect openings;

performing a reflow step to round the corners of said contact openings; and filling said interconnect openings and said contact openings with a conductive material.

9. The method of claim 8 further including the step of forming a liner oxide between said substrate and said insulating layer.

10. The method of claim 8 further including the step of polishing said insulating layer by CMP.

11. The method of claim 8 wherein said nitride layer is $Si_3N_4$.

12. The method of claim 8 wherein said reflow step is a RTP at 950° C. to 1100° C. for 10 to 30 seconds.

13. The method of claim 7 wherein said reflow step is an atmospheric pressure CVD step at 850° C. to 900° C. for 5 to 30 minutes.

* * * * *